United States Patent
Kotzur et al.

(10) Patent No.: US 9,400,748 B2
(45) Date of Patent: *Jul. 26, 2016

(54) SYSTEM AND METHOD FOR DATA INVERSION IN A STORAGE RESOURCE

(71) Applicant: Dell Products L.P., Round Rock, TX (US)

(72) Inventors: Gary B. Kotzur, Austin, TX (US); William Price Dawkins, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/595,511

(22) Filed: Jan. 13, 2015

(65) Prior Publication Data
US 2015/0127893 A1    May 7, 2015

Related U.S. Application Data

(63) Continuation of application No. 13/295,720, filed on Nov. 14, 2011, now Pat. No. 8,954,651.

(51) Int. Cl.
*G06F 12/02*   (2006.01)
*G11C 16/10*   (2006.01)
*G11C 16/34*   (2006.01)

(52) U.S. Cl.
CPC ............ *G06F 12/0246* (2013.01); *G11C 16/10* (2013.01); *G11C 16/349* (2013.01); *G06F 2212/1036* (2013.01); *G06F 2212/2022* (2013.01); *G06F 2212/7211* (2013.01)

(58) Field of Classification Search
CPC ............ G06F 11/1048; G06F 11/1016; G06F 11/108; G06F 11/1044; G06F 21/60; G06F 21/6254; G06F 11/1012
See application file for complete search history.

(56) References Cited

U.S. PATENT DOCUMENTS

| 5,873,112 A | 2/1999 | Norman | 711/103 |
| 2007/0079204 A1 | 4/2007 | Ong | 714/738 |

*Primary Examiner* — Reginald Bragdon
*Assistant Examiner* — Thanh Vo
(74) *Attorney, Agent, or Firm* — Baker Botts L.L.P.

(57) ABSTRACT

A method may comprise receiving a page of data to be stored on a storage resource. The method may also comprise determining, for each particular inversion mode of a plurality of inversion modes, the number of bits of the page of data to be inverted to store a representation of the page of data in accordance with the particular inversion mode. The method may additionally comprise determining a selected inversion mode from the plurality of inversion modes for the page of data, the selected inversion mode comprising the inversion mode for which the least number of physical bit transitions are required to store the representation of the page of data in accordance with the selected inversion mode. The method may further comprise storing the representation of the page of data in a data memory in accordance with the inversion mode.

20 Claims, 1 Drawing Sheet

SYSTEM AND METHOD FOR DATA INVERSION IN A STORAGE RESOURCE

CROSS-REFERENCES TO RELATED APPLICATIONS

The present application is a continuation of U.S. patent application Ser. No. 13/295,720 filed Nov. 14, 2011, which is hereby incorporated by reference in its entirety for all purposes.

TECHNICAL FIELD

The present disclosure relates in general to information handling systems, and more particularly to data inversion in storage resources.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For many years, physical storage resources were typically implemented using magnetic storage media. However, in recent years, the industry has shifted to using solid-state storage devices in place of magnetic storage media. Solid-state storage devices may be desirable over magnetic storage media due to reduced latency, higher performance, fewer mechanical components, and other reasons.

However, a problem related to the use of solid-state storage devices is known as "wear out" in which a particular storage device may lose functionality due to repeated use. In particular, flash cells making up solid-state storage devices are stressed during the process of writing data to cells, and such during such write operations. To illustrate, solid-state storage devices are typically based on NAND flash technology which, when written to must erase old data in a storage location before new data can be written. An erased cell typically has a logic value of "1" using NAND flash technology. Thus, writing a logic value of "1" to a NAND flash cell may have minimal effect on flash cell longevity, while writing a logic value of "0" (and later erasing such value to the logic value of "1") may stress the flash cell, thus reducing cell life.

SUMMARY

In accordance with the teachings of the present disclosure, the disadvantages and problems associated with storage device longevity have been reduced or eliminated.

In accordance with embodiments of the present disclosure, a method may comprise receiving a page of data to be stored on a storage resource. The method may also comprise determining, for each particular inversion mode of a plurality of inversion modes, the number of bits of the page of data to be inverted to store a representation of the page of data in accordance with the particular inversion mode. The method may additionally comprise determining a selected inversion mode from the plurality of inversion modes for the page of data, the inversion mode for which the least number of physical bit transitions are required to store the representation of the page of data in accordance with the selected inversion mode. The method may further comprise storing the representation of the page of data in a data memory in accordance with the inversion mode. Each particular inversion mode may define an identity of bits within the page of data that are logically inverted to generate the representation of the page of data when the particular inversion mode as the selected inversion mode.

In accordance with additional embodiments of the present disclosure, a storage resource may comprise a data memory configured to store data and logic communicatively coupled to the data memory. The logic may be configured to receive a page of data to be stored on the storage resource. The logic may also be configured to determine, for each particular inversion mode of a plurality of inversion modes, the number of bits of the page of data to be inverted to store a representation of the page of data in accordance with the particular inversion mode. The logic may additionally be configured to determine a selected inversion mode from the plurality of inversion modes for the page of data, the inversion mode for which the least number of physical bit transitions are required to store the representation of the page of data in accordance with the selected inversion mode. The logic may further be configured to store the representation of the page of data in the data memory in accordance with the inversion mode. Each particular inversion mode may define an identity of bits within the page of data that are logically inverted to generate the representation of the page of data when the particular inversion mode as the selected inversion mode.

In accordance with further embodiments of the present disclosure, an information handling system may include a processor and storage resource communicatively coupled to the processor. The storage resource may be configured to receive a page of data to be stored on the storage resource. The storage resource may also determine, for each particular inversion mode of a plurality of inversion modes, the number of bits of the page of data to be inverted to store a representation of the page of data in accordance with the particular inversion mode. The storage resource may additionally be configured to determine a selected inversion mode from the plurality of inversion modes for the page of data, the inversion mode for which the least number of physical bit transitions are required to store the representation of the page of data in accordance with the selected inversion mode. The storage resource may further be configured to store the representation of the page of data in a data memory of the storage resource in accordance with the inversion mode. Each particular inversion mode may define an identity of bits within the page of data that are logically inverted to generate the representation of the page of data when the particular inversion mode as the selected inversion mode.

Technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
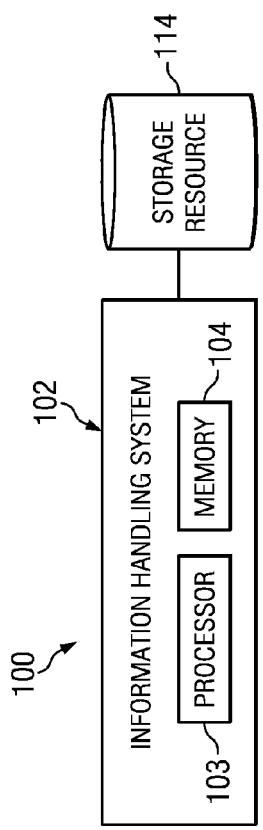
FIG. 1 is a block diagram of an example system, in accordance with certain embodiments of the present disclosure.
Figure 2:
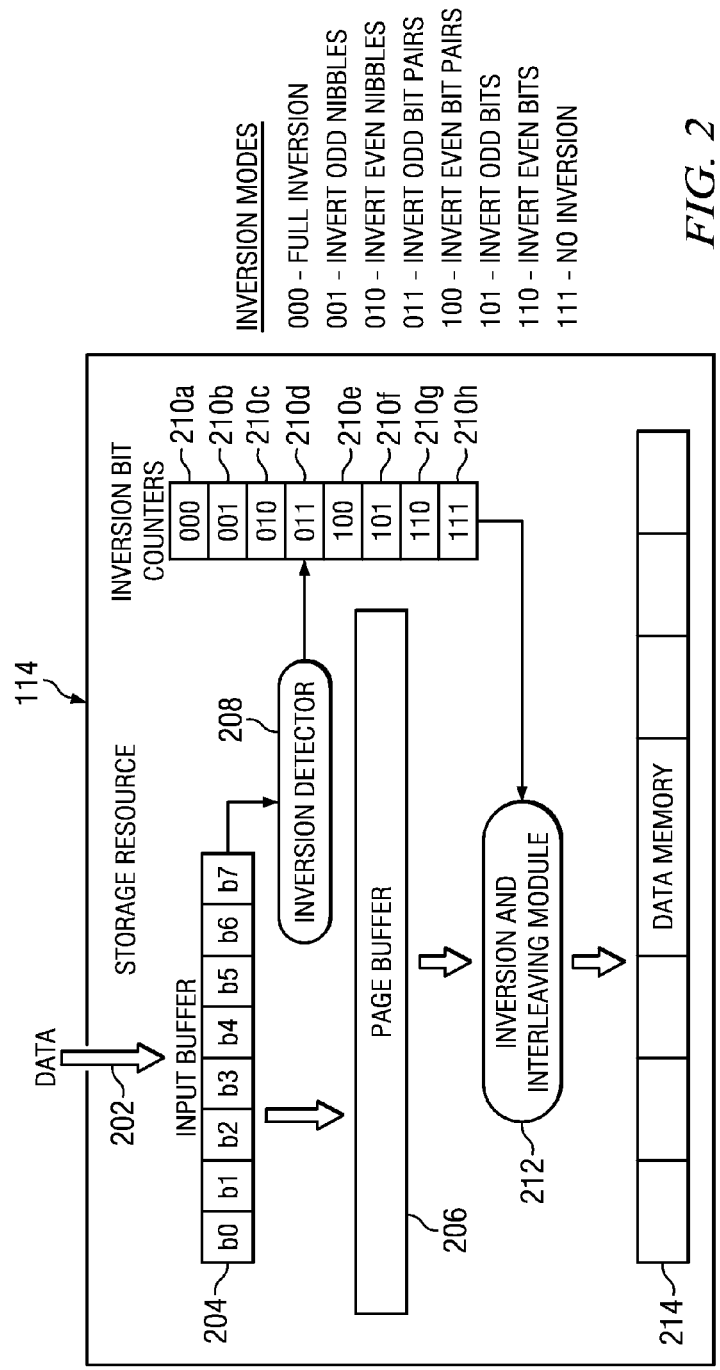
FIG. 2 illustrates a diagram depicting selected elements of a storage resource and a flow for a method of data inversion for data to be stored on the storage resource, in accordance with the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

An information handling system may include or may be coupled to an array of physical storage resources. The array of physical storage resources may include a plurality of physical storage resources, and may be operable to perform one or more input and/or output storage operations, and/or may be structured to provide redundancy. In operation, one or more physical storage resources disposed in an array of physical storage resources may appear to an operating system as a single logical storage unit or "virtual storage resource."

In certain embodiments, an array of physical storage resources may be implemented as a Redundant Array of Independent Disks (also referred to as a Redundant Array of Inexpensive Disks or a RAID). RAID implementations may employ a number of techniques to provide for redundancy, including striping, mirroring, and/or parity checking. As known in the art, RAIDs may be implemented according to numerous RAID levels, including without limitation, standard RAID levels (e.g., RAID 0, RAID 1, RAID 3, RAID 4, RAID 5, and RAID 6), nested RAID levels (e.g., RAID 01, RAID 03, RAID 10, RAID 30, RAID 50, RAID 51, RAID 53, RAID 60, RAID 100), non-standard RAID levels, or others.

FIG. 1 is a block diagram of an example system 100, in accordance with certain embodiments of the present disclosure. As depicted in FIG. 1, system 100 may include an information handling system 102 and at least one storage resource 114.

Information handling system 102 may generally be operable to receive data from and/or communicate data to storage resource 114. In certain embodiments, information handling system 102 may be a server. In another embodiment, information handling system 102 may be a personal computer (e.g., a desktop computer or a portable computer). As depicted in FIG. 1, information handling system 102 may include a processor 103 and a memory 104 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Storage resource 114 may include a hard disk drive, magnetic tape library, optical disk drive, magneto-optical disk drive, compact disk drive, compact disk array, disk array controller, and/or any computer-readable medium operable to store data. In particular embodiments, one or more storage resources 114 may comprise solid-state storage devices. In some embodiments, a storage resource 114 may, along with other storage resources 114, form all or part of a redundant storage array (e.g., a RAID). In such embodiments, storage resources participating in the redundant storage array may appear to an operating system executing on information handling system 102 as a single logical storage unit or virtual resource. Thus, information handling system 102 may "see" a logical unit instead of seeing each individual physical storage resource. Although FIG. 1 depicts storage resource 114 as a component of system 100 separate from information handling system 102, in some embodiments, one or more storage resources 114 may be integral to information handling system 102.

FIG. 2 illustrates a diagram depicting selected elements of storage resource 114 and a flow for a method of data inversion for data to be stored on storage resource 114, in accordance with the present disclosure. As shown in FIG. 2, storage resource 114 may include an input buffer 204, a page buffer 206, an inversion detector 208, inversion bit counters 210 (e.g., inversion bit counters 210a-210h), inversion and interleaving module 212, and data memory 214.

As depicted in FIG. 2, data 202 to be stored on storage resource 114 may be communicated to and received by storage resource 114. Upon receipt by storage resource 114, data 202 may be, on a byte-by-byte basis or other suitably-sized data size basis, temporarily stored in input buffer 204. Input buffer 204 may include any suitable computer-readable medium for storing such data. Although input buffer 204 is depicted in FIG. 2 as comprising a byte-long buffer (e.g., storing bits b0-b7 of a byte), input buffer 204 may be of any suitable size.

Input buffer 204 may communicate its buffered data to a page buffer 206 and an inversion detector 208. Page buffer 206 may include any suitable computer-readable medium for storing data, and may be configured to store multiple data units (e.g., bytes) received from input buffer 204 and buffer such multiple data units as a page for storage within data memory 214, as described below. Page buffer 206 may be of any suitable size (e.g., four kilobytes).

Inversion detector 208 may include any system, device, or apparatus configured to detect, for each successive data portion (e.g., byte) stored in input buffer 204, the number and positions of logic 1's and/or logic 0's stored in input buffer 204. Based on the detected numbers and positions of logic 1's and/or logic 0's, inversion detector 208 may increment one or more inversion bit counters 210, as described in greater detail below.

Each inversion bit counter 210 may include a digital counter or other suitable counter for storing a numeric value representing, for a particular page of data received by storage resource 114, a number of occurrences of particular bit patterns in the successive data portions (e.g., bytes) of the page stored in input buffer 204. Each inversion bit counter 210 may be associated with a respective inversion mode.

An inversion mode may define, for a page of data stored in data memory 214, identity of bits that are logically inverted from their "actual" values. Examples of different inversion modes are give under the heading "Inversion Modes" in FIG. 2. For example, inversion mode 111 is labeled as "no inversion" meaning for a particular page of data 202 received by storage resource 114, no bits within the page of data are to be inverted when stored in data memory 214. On the other hand, an inversion mode 000 labeled as "full inversion" may mean that for a particular page of data 202 received by storage resource 114, all bits within the page of data are to be inverted when stored in data memory 214. Other example inversion modes depicted in FIG. 2 are:

mode 110—"invert even bits": even-numbered bits (e.g., bits b0, b2, b4, and b6 of each byte) within a page of data are to be inverted when stored in data memory 214;

mode 101—"invert odd bits": odd-numbered bits (e.g., bits b1, b3, b5, and b7 of each byte) within a page of data are to be inverted when stored in data memory 214;

mode 100—"invert even bit pairs": even-numbered bit pairs (e.g., bits b0, b1, b4, and b5 of each byte) within a page of data are to be inverted when stored in data memory 214;

mode 011—"invert odd bit pairs": odd-numbered bit pairs (e.g., bits b2, b3, b6, and b7 of each byte) within a page of data are to be inverted when stored in data memory 214;

mode 010—"invert even nibbles": even-numbered nibbles (e.g., bits b0, b1, b2, and b3 of each byte) within a page of data are to be inverted when stored in data memory 214; and mode 001—"invert odd nibbles": odd-numbered nibbles (e.g., bits b4, b5, b6, and b7 of each byte) within a page of data are to be inverted when stored in data memory 214.

While FIG. 2 and the above discussion contemplate eight specific inversion modes, other inversion modes may be employed in addition to or in lieu of the inversion modes set forth above. For example, in some embodiments, inversion modes may include modes such as "invert first bit pair," "invert second bit pair," "invert third bit pair, "invert fourth bit pair," etc. Additionally, in some embodiments, fewer than eight inversion modes may be used.

In operation, inversion detector 208 may calculate for each successive data portion (e.g., byte) of input buffer 204 a hypothetical number of physical bit transitions required in data memory 214 to store such particular data portion for each of the various inversion modes represented by inversion bit counters 210. For example, where data memory 214 comprises NAND-based flash, inversion detector 208 may calculate for each successive data portion (e.g., byte) of input buffer 204 a hypothetical number of bit transitions from all logic 1's (e.g., from "11111111" if input buffer 204 is byte-sized) required in data memory 214 to store such particular data portion for each of the various inversion modes represented by inversion bit counters 210. As another example, where data memory 214 comprises NOR-based flash, inversion detector 208 may calculate for each successive data portion (e.g., byte) of input buffer 204 a hypothetical number of physical bit transitions from all logic 1's (e.g., from "00000000" if input buffer 204 is byte-sized) required in data memory 214 to store such particular data portion for each of the various inversion modes represented by inversion bit counters 210. Inversion detector 208 may then, based on the calculations, increment each particular inversion bit counter 210 based on the number of hypothetical physical bit transitions required for the particular inversion mode.

For example, in a data memory 214 comprises NAND-based flash, if a value in input buffer 204 is "10101010" inversion detector 208 may increment the value in inversion bit counter 210a by 4 because 4 flash cell-transitions are required to represent "10101010" if no inversion is applied. As another example, and again assuming data memory 214 comprises NAND-based flash, inversion detector 208 may increment the value in inversion bit counter 210b by 8 because 8 flash cell-transitions are required to represent "10101010" if even-bit inversion is applied. Other inversion bit counters 210 may be incremented as follows, assuming data memory 214 comprises NAND-based flash: 210c by 0 (odd-bit inversion), 210d by 4 (even-pair inversion), 210e by 4 (odd-pair inversion); 210f by 4 (even-nibble inversion), 210g by 4 (odd-nibble inversion), and 210h by 4 (full inversion).

Thus, when each page of data 202 received, inversion bit counters 210 may reset to 0 and, in concert with inversion detector 208, may determine the total number of inversions required to represent such page in data memory 214 for each of the various inversion modes.

Inversion and interleaving module 212 may include any system, device, or apparatus configured to, for each page of data, determine the counter 210 having the lowest total number, read the page of data as stored in page buffer 206, invert bits (if applicable) of the page of data in accordance with the inversion mode associated with the counter 210 having the lowest total number, and store the bit-inversion-modified data page in data memory 214. In addition, inversion and interleaving module 212 may append to or insert within the data page stored to memory 214 a field of data indicative of the inversion mode applied to the data page. For example, for the embodiment depicted in FIG. 2, a three-bit variable may be used to indicate which of the eight inversion modes has been applied to the data page. Because cells of this inversion mode field may be changed more often than data bit cells, inversion and interleaving module 212 may apply an interleaving technique to distribute or interleave the inversion mode field within the stored data. For example, a four kilobyte page with a three-bit inversion mode field may require 4099 cells to store the data plus the inversion mode field. A simple modulo function based on a logical address of the page may be used to determine the bit location insider the 4099 cells where the first inversion bit resides. Thus, the inversion mode field may be randomly distributed throughout pages stored in data memory 214, so that no individual cells are over-taxed by writing inversion mode fields.

In some embodiments, redundant copies of inversion mode bits may also be stored. For instance, if error correction code (ECC) generation for data occurs before inversion, copies of the inversion mode bits may be needed. However, if inversion occurs before ECC generation, redundant copies of inversion mode bits may not be stored.

Data memory 214 may include any suitable computer-readable medium and, in some embodiments, may comprise flash memory (e.g., NAND-based flash cells).

Once a data page has been written to data memory 214 in accordance with an inversion mode, such data page may be read by determining the inversion mode applied to the data page and inverting bits of the data page as stored in data memory 214, in order to retrieve the original data. The inversion mode may be determined by determining where the inversion mode field for such data page resides within the data page stored in data memory 214 (e.g., by performing a modulo function based on logical block address similar or identical to that described above) and reading the inversion mode field from such location within the data page.

The methods and systems described above may reduce stress placed on components (e.g., flash cells) of storage resource 114 by reducing the number of transitions required to store a representation of data in storage resource 114. The techniques disclosed herein, used in lieu of or in convert with existing wear-leveling techniques, may reduce wear of physical cell locations, thus potentially increasing storage resource life.

Although the present disclosure has been described in detail, it should be understood that various changes, substitutions, and alterations can be made hereto without departing from the spirit and the scope of the disclosure as defined by the appended claims.

What is claimed is:

1. A method comprising:
   determining, for each particular inversion mode of a plurality of inversion modes, a number of bits of a page of data to be inverted to store a representation of the page of data in accordance with the particular inversion mode;
   determining a selected inversion mode from the plurality of inversion modes, for which the least number of bits of the page are to be inverted to store the representation of the page of data in accordance with the selected inversion mode; and
   storing the representation of the page of data in a data memory in accordance with the selected inversion mode;
   wherein each particular inversion mode defines an identity of bits within the page of data that are inverted to generate the representation of the page of data;
   wherein at least one particular inversion mode defines a bit within the page of data to be inverted and a bit within the page of data not to be inverted.

2. A method according to claim 1, further comprising storing an inversion mode field indicative of the selected inversion mode as part of the representation of the page of data.

3. A method according to claim 2, wherein storing the inversion mode field comprises:
   performing a modulo function based on a logical address of the page of data; and
   storing the inversion mode field within the representation of the page of data at a location based on the modulo function.

4. A method according to claim 1, wherein the plurality of inversion modes comprise at least two of: an even-bits inversion mode, an odd-bits inversion mode, an even-bit-pairs inversion mode, an odd-bit-pairs inversion mode; and even-nibbles inversion mode; an odd-nibbles inversion mode; a first-bit-pair inversion mode; a second-bit-pair inversion mode; a third-bit-pair inversion mode; and a fourth-bit-pair inversion mode.

5. A method according to claim 1, further comprising, in response to a request to read the page of data:
   reading the representation of the page data from the data memory; and
   inverting bits of the representation of data in accordance with the selected inversion mode.

6. A method according to claim 1, wherein the data memory is a flash memory.

7. A method according to claim 1, wherein the data memory is a NAND-based flash memory.

8. A storage resource comprising:
   a data memory configured to store data; and
   logic communicatively coupled to the data memory and configured to:
      determine, for each particular inversion mode of a plurality of inversion modes, a number of bits of a page of data to be inverted to store a representation of the page of data in accordance with the particular inversion mode;
      determine a selected inversion mode from the plurality of inversion modes for the page of data, for which the least number of bits are to be inverted to store the representation of the page of data in accordance with the selected inversion mode; and
      store the representation of the page of data in the data memory in accordance with the inversion mode;
   wherein each particular inversion mode defines an identity of bits within the page of data that are inverted to generate the representation of the page of data;
   wherein at least one particular inversion mode defines a bit within the page of data to be inverted and a bit within the page of data not to be inverted.

9. A storage resource according to claim 8, the logic further configured to store an inversion mode field indicative of the selected inversion mode as part of the representation of the page of data.

10. A storage resource according to claim 9, the logic further configured to, in order to store the inversion mode field:
    perform a modulo function based on a logical address of the page of data; and
    store the inversion mode field within the representation of the page of data at a location based on the modulo function.

11. A storage resource according to claim 8, wherein the plurality of inversion modes comprise at least two of: an even-bits inversion mode, an odd-bits inversion mode, an even-bit-pairs inversion mode, an odd-bit-pairs inversion mode; and even-nibbles inversion mode; an odd-nibbles inversion mode; a first-bit-pair inversion mode; a second-bit-pair inversion mode; a third-bit-pair inversion mode; and a fourth-bit-pair inversion mode.

12. A storage resource according to claim 8, the logic further configured to, in response to a request to read the page of data:
   read the representation of the page data from the data memory; and
   invert bits of the representation of data in accordance with the selected inversion mode.

13. A storage resource according to claim 8, wherein the data memory is a flash memory.

14. A storage resource according to claim 8, wherein the data memory is a NAND-based flash memory.

15. An information handling system comprising:
   a processor; and
   a storage resource communicatively coupled to the processor and configured to:
      determine, for each particular inversion mode of a plurality of inversion modes, a number of bits of a page of data to be inverted to store a representation of the page of data in accordance with the particular inversion mode;
      determining a selected inversion mode from the plurality of inversion modes for the page of data, for which the least number of physical bit transitions are required to store the representation of the page of data in accordance with the selected inversion mode; and
      store the representation of the page of data in a data memory of the storage resource in accordance with the inversion mode;
      wherein each particular inversion mode defines an identity of bits within the page of data that are logically inverted to generate the representation of the page of data;
      wherein at least one particular inversion mode defines a bit within the page of data to be inverted and a bit within the page of data not to be inverted.

16. An information handling system according to claim 15, the storage resource further configured to store an inversion mode field indicative of the selected inversion mode as part of the representation of the page of data.

17. An information handling system according to claim 15, the storage resource further configured to, in order to store the inversion mode field:
   perform a modulo function based on a logical address of the page of data; and
   store the inversion mode field within the representation of the page of data at a location based on the modulo function.

18. An information handling system according to claim 15, wherein the plurality of inversion modes comprise at least two of: an even-bits inversion mode, an odd-bits inversion mode, an even-bit-pairs inversion mode, an odd-bit-pairs inversion mode; and even-nibbles inversion mode; an odd-nibbles inversion mode; a first-bit-pair inversion mode; a second-bit-pair inversion mode; a third-bit-pair inversion mode; and a fourth-bit-pair inversion mode.

19. An information handling system according to claim 15, the storage resource further configured to, in response to a request to read the page of data:
   read the representation of the page data from the data memory; and
   invert bits of the representation of data in accordance with the selected inversion mode.

20. An information handling system according to claim 15, wherein the data memory is a flash memory.

* * * * *